(12) United States Patent
Ito (10) Patent No.: US 10,381,549 B2
(45) Date of Patent: Aug. 13, 2019

(54) MEMORY DEVICE

(71) Applicant: TOSHIBA MEMORY CORPORATION, Minato-ku, Tokyo (JP)

(72) Inventor: Yuichi Ito, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/914,586

(22) Filed: Mar. 7, 2018

(65) Prior Publication Data

US 2019/0088854 A1 Mar. 21, 2019

(30) Foreign Application Priority Data

Sep. 19, 2017 (JP) ................. 2017-179325

(51) Int. Cl.
*G11C 11/16* (2006.01)
*H01L 27/22* (2006.01)
*H01L 43/02* (2006.01)
*H01L 43/08* (2006.01)
*H01L 43/10* (2006.01)

(52) U.S. Cl.
CPC ............ *H01L 43/02* (2013.01); *G11C 11/161* (2013.01); *H01L 27/222* (2013.01); *H01L 43/08* (2013.01); *H01L 43/10* (2013.01)

(58) Field of Classification Search
CPC .............. G11C 11/161; G11C 11/1655; G11C 11/1657; G11C 11/1659; G11C 11/1675; G11C 13/0069; G11C 11/1653; G11C 11/1673; H01L 27/222; H01L 43/02; H01L 43/08; H01L 43/10; H01L 27/228; H01L 43/12; H01L 27/227
See application file for complete search history.

(56) References Cited

U.S. PATENT DOCUMENTS

| | | | |
|---|---|---|---|
| 8,861,263 B2 | 10/2014 | Lee | |
| 2006/0262594 A1* | 11/2006 | Fukumoto | B82Y 25/00 365/158 |
| 2013/0168788 A1* | 7/2013 | Wang | G01R 33/098 257/421 |
| 2014/0292312 A1* | 10/2014 | Chen | G01R 33/098 324/207.21 |

(Continued)

FOREIGN PATENT DOCUMENTS

| | | |
|---|---|---|
| JP | 2006210396 A | 8/2006 |
| JP | 2009200123 A | 9/2009 |
| JP | 2013041961 A | 2/2013 |

*Primary Examiner* — Mark W Tornow
*Assistant Examiner* — Priya M Rampersaud
(74) *Attorney, Agent, or Firm* — Holtz, Holtz & Volek PC (57) ABSTRACT

A memory device includes a first element and a second element. The first element includes: first and second ferromagnets; a first nonmagnet; a first conductor; a third ferromagnet; a second conductor, and a fourth ferromagnet. The fourth ferromagnet contains a metallic element and one or more ferromagnetic elements. The second element includes: fifth and sixth ferromagnet; a second nonmagnet; a third conductor; a seventh ferromagnet; a fourth conductor; and a fifth conductor. The fifth conductor contains the metallic element and the one or more ferromagnetic elements of a quantity of 30% or less of a volume of the fifth conductor.

19 Claims, 6 Drawing Sheets

(56) References Cited

U.S. PATENT DOCUMENTS

| | | | |
|---|---|---|---|
| 2015/0069556 A1* | 3/2015 | Yamakawa | H01L 43/02 257/421 |
| 2015/0070128 A1* | 3/2015 | Ueda | H01L 43/08 338/32 R |
| 2015/0357376 A1* | 12/2015 | Seo | H01L 27/228 257/252 |
| 2016/0049185 A1* | 2/2016 | Lu | G11C 11/1659 365/158 |
| 2016/0260466 A1* | 9/2016 | Katayama | G11C 11/161 |

\* cited by examiner

MEMORY DEVICE

CROSS-REFERENCE TO RELATED APPLICATIONS

This application is based upon and claims the benefit of priority from Japanese Patent Application No. 2017-179325, filed Sep. 19, 2017, the entire contents of which are incorporated herein by reference.

FIELD

Embodiments described herein relate generally to a memory device.

BACKGROUND

Memory devices that tore data using the magnetoresistive effect are known.

DETAILED DESCRIPTION

In general, according to one embodiment, a memory device includes a first element and a second element. The first element includes: a first ferromagnet; a second ferromagnet; a first nonmagnet between the first and second ferromagnets; a first conductor on the second ferromagnet; a third ferromagnet on the first conductor; a second conductor on the third ferromagnet, and a fourth ferromagnet on the second conductor. The fourth ferromagnet contains a metallic element and one or more ferromagnetic elements. The second element includes: a fifth ferromagnet; a sixth ferromagnet; a second nonmagnet between the fifth and sixth ferromagnets; a third conductor on the sixth ferromagnet; a seventh ferromagnet on the third conductor; a fourth conductor on the seventh ferromagnet; and a fifth conductor on the fourth conductor. The fifth conductor contains the metallic element and the one or more ferromagnetic elements of a quantity of 30% or less of a volume of the fifth conductor.

Embodiments will now be described with reference to the figures. In the following description, components with substantially the same functionalities and configurations will be referred to with the same reference numerals, and repeated descriptions may be omitted. The figures are schematic, and the relations between the thickness and the area of a plane of a layer and ratios of thicknesses of layers may differ from actual ones. Moreover, the figures may include components which differ in relations and/or ratios of dimensions in different figures. Moreover, the entire description for a particular embodiment also applies to another embodiment unless it is explicitly mentioned otherwise or obviously eliminated. Each embodiment illustrates devices and methods, only as examples, for embodying the technical idea of that embodiment, which does not specify the natures, shapes, structures, arrangement, etc., of components to the following examples.

In the specification and the claims, a phrase of a particular first component being "coupled" to another second component includes the first component being coupled to the second component either directly or via one or more components which are always or selectively conductive.

First Embodiment

[1-1. Structure (Configuration)]

Figure 1:
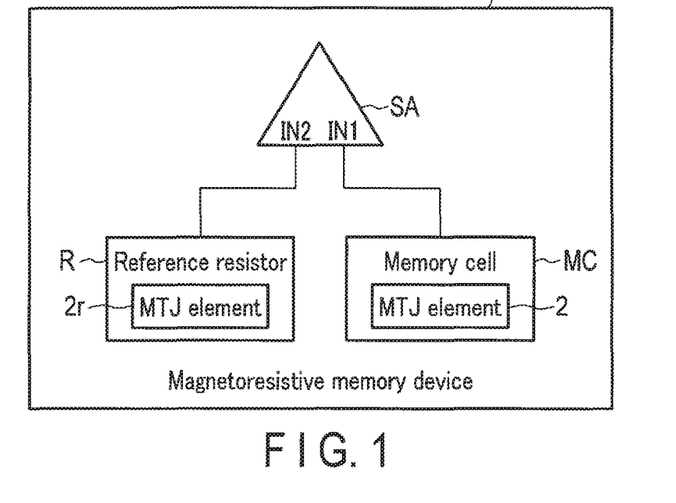
FIG. 1 is a circuit diagram of apart of a magnetoresistive memory device according to the first embodiment.

FIG. 1 is a circuit diagram of a part of a magnetoresistive memory device 1 according to the first embodiment. As illustrated in FIG. 1, the magnetoresistive memory device 1 includes a memory cell MC, a reference resistor R, and a sense amplifier circuit SA. The memory cell MC can store one-bit data, and includes a magnetic tunnel junction (MTJ) element 2. The MTJ element 2 is coupled to a first input IN1 of the sense amplifier circuit SA directly through one or more interconnects and/or one or more switches (not shown), such as a transistor.

The reference resistor R has a resistance of a particular magnitude, and includes one or more MTJ elements $2r$. At least one MTJ element $2r$ is coupled to a second input IN2 of the sense amplifier circuit SA directly through one or more interconnects and/or one or more switches (not shown), such as a transistor.

The magnetoresistive memory device 1 applies a voltage to the memory cell MC and the reference resistor R during a read. This voltage application allows a cell current to flow through the memory cell MC and the first input IN1 of the sense amplifier circuit SA, and a reference current to flow through the reference resistor R and the second input IN2 of the sense amplifier circuit SA. The sense amplifier circuit SA compares the cell current with the reference current, and based on the result of the comparison determines the data currently stored in the memory cell MC.

Figure 2:
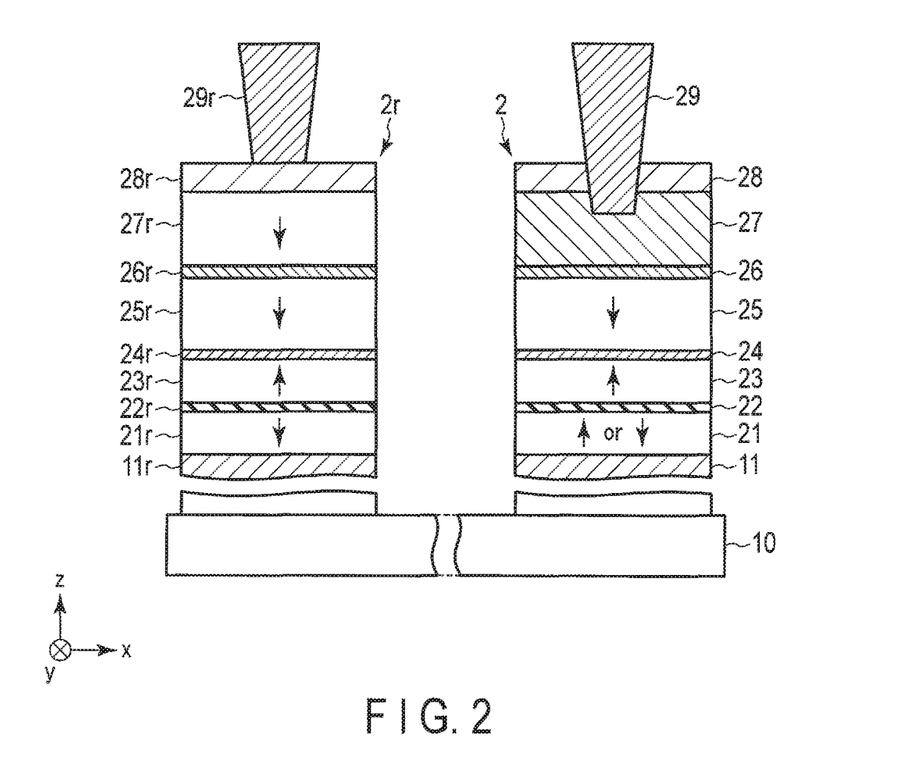
FIG. 2 illustrates a cross-sectional structure of a part of the magnetoresistive memory device according to the first embodiment.

FIG. 2 illustrates a cross-sectional structure of a part of the magnetoresistive memory device 1 according to the first embodiment, and in particular a cross-sectional structure of the MTJ element 2 and the MTJ element $2r$.

The MTJ element 2 is located on a conductor 11 above the substrate 10. The conductor 11 is an electrode, for example.

The MTJ element 2 includes a ferromagnet 21, a nonmagnet 22, a ferromagnet 23, a conductor 24, a ferromagnet 25, a conductor 26, a metal layer (conductor) 27, and a conductor 28. The ferromagnet 21, nonmagnet 22, ferromagnet 23, conductor 24, ferromagnet 25, conductor 26, metal layer 27, and conductor 28 are stacked in this order along the z-axis.

The ferromagnet 21 contains or is made of one or more conductive ferromagnetic elements. Specifically, the ferromagnet 21 contains one or more of elements of iron (Fe), boron (B), and cobalt (Co), and contains cobalt-iron-boron (CoFeB) or boride iron (FeB), for example. Alternatively, the ferromagnet 21 contains or is made of an alloy of two or more elements of Co, Fe, and B.

The ferromagnet 21 is magnetized in the direction along a particular axis, and has a magnetization easy axis along an axis that penetrates the boundaries of the ferromagnet 21, nonmagnet 22, the ferromagnet 23, the conductor 24, the ferromagnet 25, the conductor 26, the metal layer 27, and the conductor 28, such as the z-axis. Hereinafter, when a ferromagnet has a magnetic anisotropy along an axis that penetrates the boundaries of the ferromagnet 21, the nonmagnet 22, the ferromagnet 23, the conductor 24, the ferromagnet 25, conductor 26, the metal layer 27, and the conductor 28 (in particular z-axis), that ferromagnet is referred to as having a perpendicular magnetic anisotropy. The magnetization of the ferromagnet 21 can stabilize in either of the two directions along with the magnetization easy axis. The direction of the magnetization of a substance is illustrated by an arrow in that substance in the figure. The direction of the magnetization of the ferromagnet 21 can be switched by a current that flows through the ferromagnet 21, the nonmagnet 22, and the ferromagnet 23, or a write current. The ferromagnet 21 may be generally referred to as a storage layer, etc.

The nonmagnet 22 contains or is made of one or more nonmagnetic insulative elements, and serves as a tunnel barrier. The nonmagnet 22 contains or is made of magnesium oxide (MgO), for example.

The ferromagnet 23 contains or is made of one or more conductive ferromagnetic elements. The ferromagnet 23 contains or is made of one of cobalt platinum (CoPt), cobalt nickel (CoNi) or cobalt palladium (CoPd), for example. Tile ferromagnet 23 may also include a stack of two or more layers that respectively contain different ones of cobalt (Co), platinum (Pt), palladium (Pd), and nickel (Ni), or the alloy of two or more of these elements. The ferromagnet 23 has the perpendicular magnetic anisotropy. The ferromagnet 23 has a magnetization with a fixed or invariable direction, and has a larger coercivity than that of the ferromagnet 21, for example. The magnetization direction of the ferromagnet 23 being "fixed" or "invariable" refers to the magnetization direction of the ferromagnet 23 not being switched by a write current of a magnitude that switches the magnetization direction of the ferromagnet 21. The ferromagnet 23 may be generally referred to as a reference layer, etc.

The set of the ferromagnet 21, the nonmagnet 22, and the ferromagnet 23 exhibits the magnetoresistive effect. Specifically, the MTJ element 2 exhibits the minimum and maximum resistances when the magnetization direction of the ferromagnet 21 is parallel and antiparallel with the magnetization direction of the ferromagnet 23, respectively. The states where MTJ elements including the MTJ element 2 exhibit the minimum and maximum resistances are referred to as a P-state and an AP-state, respectively. Whether the MTJ element 2 is in the P-state or the AP-state, or the magnetization direction of the ferromagnet 21, can be used to store data in the memory cell MC.

The ferromagnet 25 contains or is made of one or more conductive ferromagnetic elements. The ferromagnet 25 has a function to suppress or offset a magnetic field that is generated by the ferromagnet 23 and applied to the ferromagnet 21, or a stray magnetic field. Specifically, the magnetic field generated by the ferromagnet 23 in the ferromagnet 21 is suppressed or offset by the magnetic field that is generated by the ferromagnet 25, reaches the inside of the ferromagnet 21, and has the magnetic lines of force of direction opposite to the direction of the magnetic lines of force by the ferromagnet 23. For this reason, the tendency of the magnetization direction of the ferromagnet 21 to be aligned along one of the two directions along the magnetization easy axis, has the same or substantially the same or a small difference from that along the other of the two directions. In other words, the MTJ element 2 has a shift magnetic field of a magnitude of zero, substantially zero, or close to zero.

The ferromagnet 25 is more distant from the ferromagnet 21 than the ferromagnet 23, and the magnitude of the magnetic field generated in the ferromagnet 21 by the ferromagnet 25 is smaller than that generated by the ferromagnet 23. For this reason, the ferromagnet 25 has a saturation magnetization (Ms) and/or a residual magnetization (Mc) respectively smaller than the saturation magnetization and/or the residual magnetization of the ferromagnet 23 in order to generate in the ferromagnet 21 a magnetic field of a magnitude similar to a magnitude of the magnetic field generated in the ferromagnet 21 by the ferromagnet 23 from the position distant from the ferromagnet 23. More specifically, the ferromagnet 25 is made of the same or substantially the same material (substance) as that of the ferromagnet 23, and has a larger volume (dimensions) than that of the ferromagnet 23, for example. The ferromagnet 25 may be generally referred to as a shift cancellation layer, etc.

The conductor 24 antiferromagnetically couples the ferromagnets 23 and 25. With this function of the conductor 24, the ferromagnet 23, the conductor 24, and the ferromagnet 25 make a synthetic antiferromagnetic (SAF) structure. The conductor 24 contains or is made of one or more of ruthenium (Ru), iridium (Ir), rhodium (Rh), and osmium (Os), for example. The conductor 24 may further include a layer of Pt and/or Pd.

Ru ferromagnetically or antiferromagnetically couples two ferromagnets that sandwich the layer of Ru based on thickness of the layer. The conductor 24 with Ru therein includes or is made of a layer of Ru of a thickness that antiferromagnetically couples the ferromagnets 23 and 25, and for example, the Ru layer has a thickness larger than or equal to 0.3 nm and smaller than or equal to 1.5 nm. The antiferromagnetic coupling tends to be large when the conductor 24 has a thickness between about 1.0 nm and about 0.5.

The following description relates to an example where the ferromagnet 23 has an upward magnetization direction and the ferromagnet 25 has a downward magnetization direction. The ferromagnets 23 and 25 may have downward and upward magnetization directions, respectively.

The conductor 26 and the metal layer 27 will be described in full detail later.

The conductor 28 serves as a stopper for etching.

The MTJ element $2r$ is located on a conductor $11r$ above the substrate 10. The MTJ element $2r$ includes a ferromagnet $21r$, a nonmagnet $22r$, a ferromagnet $23r$, a conductor $24r$, a ferromagnet $25r$, a conductor $26r$, a ferromagnet $27r$, and a conductor $28r$. The ferromagnet $21r$, the nonmagnet $22r$, the ferromagnet $23r$, the conductor $24r$, the ferromagnet $25r$, the conductor $26r$, the ferromagnet $27r$, and the conductor $28r$ are stacked in this order along the z-axis. The ferromagnet $21r$, the nonmagnet $22r$, the ferromagnet $23r$, the conductor $24r$, the ferromagnet $25r$, the conductor $26r$, the ferromagnet $27r$, and the conductor $28r$ are respectively located at the same or substantially the same levels as the ferromagnet 21, the nonmagnet 22, the ferromagnet 23, the conductor 24, the ferromagnet 25, the conductor 26, the metal layer 27, and the conductor 28. Moreover, the ferromagnet $21r$, the nonmagnet $22r$, ferromagnet $23r$, the conductor $24r$, the ferromagnet $25r$, the conductor $26r$, and the conductor $28r$ may respectively have the same or substantially the same dimensions as the ferromagnet 21, nonmagnet 22, ferromagnet 23, conductor 24, ferromagnet 25, conductor 26, and conductor 28.

The ferromagnet 21r, the nonmagnet 22r, the ferromagnet 23r, the conductor 24r, the ferromagnet 25r, the conductor 26r, and the conductor 28r are respectively made of the same materials as and can be formed through the same processes in parallel with the ferromagnet 21, the nonmagnet 22, the ferromagnet 23, the conductor 24, the ferromagnet 25, the conductor 26, and the conductor 28. Therefore, the above-described features of the ferromagnet 21, the nonmagnet 22, the ferromagnet 23, the conductor 24, the ferromagnet 25, and the conductor 28 are applicable to the ferromagnet 21r, the nonmagnet 22r, the ferromagnet 23r, the conductor 24r, the ferromagnet 25r, and the conductor 28r.

The ferromagnet 27r fixes the magnetization direction of the ferromagnet 21r is the direction opposite to that of the ferromagnet 23r more strongly than in the case without the ferromagnet 27r. To this end, the ferromagnet 27r has the perpendicular magnetic anisotropy and a high saturation magnetization and/or residual magnetization. In particular, since the ferromagnet 27r is distant from the ferromagnet 21r, it has a saturation magnetization and/or a residual magnetization of magnitudes that allow the ferromagnet 27r to generate in the ferromagnet 21r a magnetic field that can fix the magnetization direction of the ferromagnet 21r even if it has the distance. Since the magnitudes of the saturation magnetization and/or the residual magnetization depend on the dimensions of a ferromagnet, the ferromagnet 27r has a volume to generate in the ferromagnet 21r a magnetic field of a magnitude useful to fix the magnetization of the ferromagnet 21r.

The ferromagnet 27r has a magnetization direction opposite to that of the ferromagnet 23r in order to generate in the ferromagnet 21r a magnetic field of the direction opposite to the magnetization direction of the ferromagnet 23r. In the ongoing example, the ferromagnet 27r has a downward magnetization. For this reason, the MTJ element 2r has a downward shift magnetic field, and stabilizes in the AP-state more easily than the P-state. The ferromagnet 27r may also have a high coercivity Hc. Alternatively, the ferromagnet 27r may have the same magnetization direction as that of the ferromagnet 23r.

The ferromagnet 27r contains one or more ferromagnetic elements, and one or more metallic elements. Examples of the ferromagnetic elements include Fe, Co, and Ni. Examples of the metallic elements include a precious metal element, or Pt and Pd. The ferromagnet 27r may include an alloy of a ferromagnetic element and a metallic element, or an alloy of a ferromagnetic element and a precious metal element. Alternatively, the ferromagnet 27r includes or is made of a layer of a ferromagnetic element and a layer of a metallic element. For example, the ferromagnet 27r includes layers of a ferromagnetic element and layers of a metallic element stacked alternately.

The metal layer 27 has the same or substantially the same dimensions as those of the ferromagnet 27r, originates in the same material as the ferromagnet 27r, and contains the same elements as those of the ferromagnet 27r. Specifically, the metal layer 27 contains one or more of one or more ferromagnetic elements contained in the ferromagnet 27r, and contains one or more metallic elements contained in the ferromagnet 27r. However, the metal layer 27 contains a different total amount of the ferromagnetic elements as those contained in the ferromagnet 27r. The metal layer 27 only contains the ferromagnetic elements of a quantity that allows a write current flowing through the MTJ element 2 to apply to the ferromagnet 21 a magnetic field of a magnitude that can switch the resistance state of the MTJ element 2. Specifically, the metal layer 27 only contains the ferromagnetic elements of a quantity in which the magnetic field formed in the ferromagnet 21 by the ferromagnetic elements in the metal layer 27 does not prevent data writes to the MTJ element 2. More specifically, the metal layer 27 contains the ferromagnetic elements of a quantity of 30% or less of the volume of the metal layer 27.

The conductors 26 and 26r can be made of the same material, and formed in parallel through the same processes. The conductors 26 and 26r contain or are made of materials with a high etching selectivity to the ferromagnetic elements in the ferromagnet 27r. Specifically, the conductors 26 and 26r contain or are made of one or more of gold (Au), silver (Ag), Pt, Pd, Rh, Ir, Ru, and Os. The conductors 26 and 26r may include an alloy of two or more of Au, Ag, Pt, Pd, Rh, Ir, Ru, and Os, or a stack of layers respectively including different ones of such elements.

The conductors 26 and 26r may also have a function to antiferromagnetically couple the ferromagnets 25r and 27r. In that case, each of the conductors 26 and 26r includes or is made of a layer of Ru, and the Ru layer has a thickness to antiferromagnetically couple the ferromagnets 25r and 27r.

The electrode 29 is located above and inside the conductor 28, includes a portion ranging from the top to the bottom of the conductor 28, and is in contact with the metal layer 27. The bottom of the electrode 29r is in contact with the top of the conductor 28r.

An area above the substrate 10 free from the components illustrated in FIG. 2 is provided with an insulator (not shown).

[1-2. Manufacturing Process]

FIGS. 3 to 6 illustrate states in a manufacturing process of the magnetoresistive memory device 1 according to the first embodiment in order.

Figure 3:
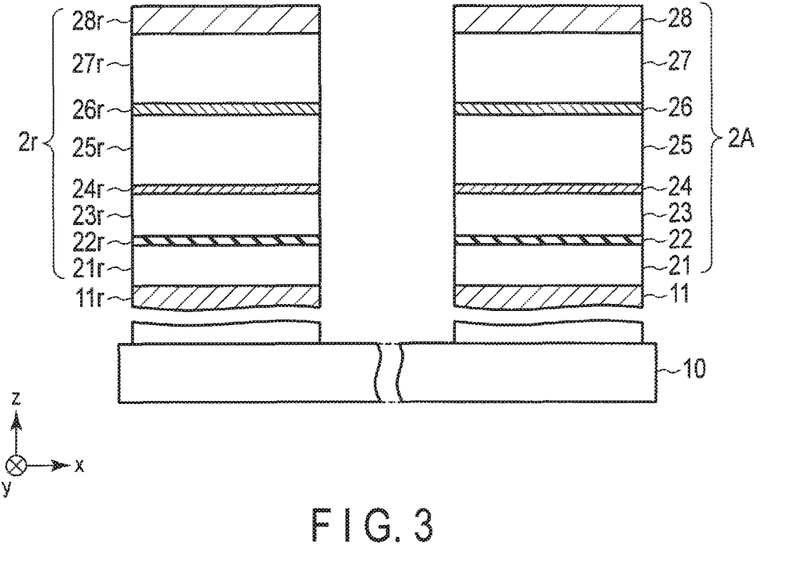
FIG. 3 illustrates one state during a manufacturing process of the magnetoresistive memory device according to the first embodiment.

As illustrated in FIG. 3, the MTJ element 2r is formed on the conductor 11r, and a structure including the ferromagnet 21, the nonmagnet 22, the ferromagnet 23, the conductor 24, the ferromagnet 25, the conductor 26, the ferromagnet 27a, and the conductor 28, which is referred to as an intermediate structure 2A hereinafter, is formed on the conductor 11. The MTJ element 2r and the intermediate structure 2A are formed through the following processes, for example.

The conductors 11 and 11r are formed. An insulator (not shown) is formed in an area between the conductors 11 and 11r. A ferromagnet 21A, a nonmagnet 22A, a ferromagnet 23A, a conductor 24A, a ferromagnet 25A, a conductor 26A, a ferromagnet 27A, and a conductor 28A (not shown) are deposited in order on the tops of the conductors 11 and 11r and the insulator. The ferromagnet 21A, the nonmagnet 22A, the ferromagnet 23A, the conductor 24A, the ferromagnet 25A, the conductor 26A, the ferromagnet 27A, and the conductor 28A are then etched by ion beam etching (IBE), for example, and thereby the MTJ element 2r and the intermediate structure 2A are formed.

Figure 4:
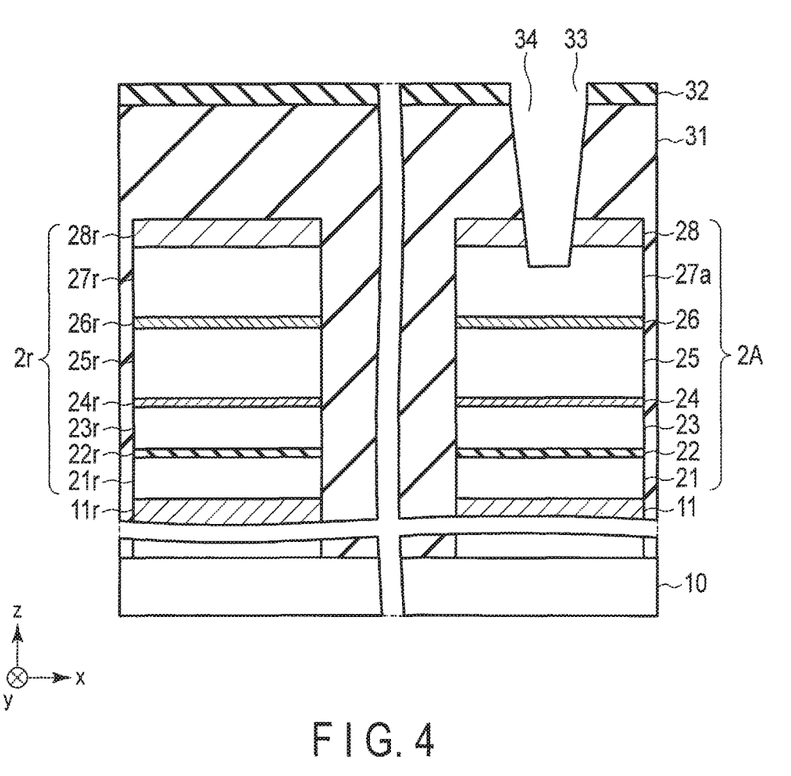
FIG. 4 illustrates a state subsequent to FIG. 3.

As illustrated in FIG. 4, an insulator 31 is formed in an area between the MTJ element 2r and the intermediate structure 2A, and on the tops of the MTJ element 2r and the intermediate structure 2A. A mask 32 is formed on the insulator 31. The mask 32 has an opening 33 above an area in which the electrode 29 will be formed. With etching through the mask 32, such as reactive ion etching (RIE), the insulator 31 is partially etched. As a result, the opening 34 is formed in a portion of the insulator 31 below the opening 33. The etching is performed so that the opening 33 extends through the conductor 28 and reaches the ferromagnet 27a. The mask 32 is then removed.

Figure 5:
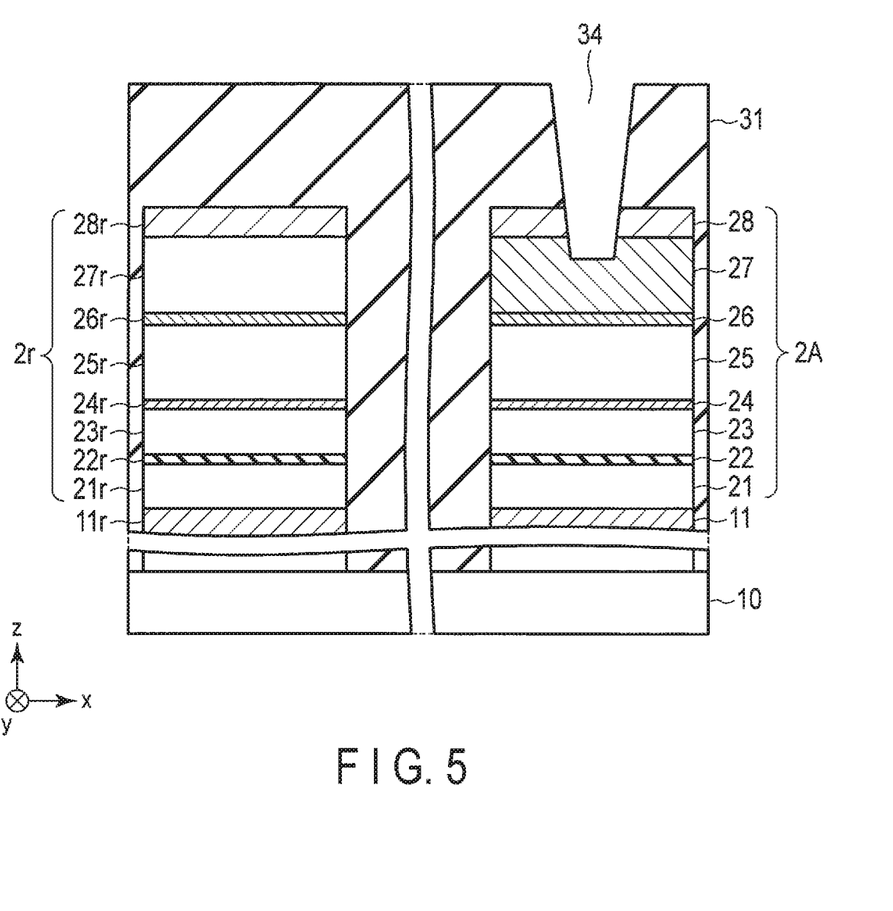
FIG. 5 illustrates a state subsequent to FIG. 4.

As illustrated in FIG. 5, the ferromagnetic elements in the ferromagnet 27a are partially removed by etching via the opening 34. The etching is, for example, wet etching, and has a high ratio of etch rates (or, selectivity) between etching to the ferromagnetic elements and the metallic elements in the ferromagnet 27a. With such etching, most ferromagnetic elements in the ferromagnet 27a are removed from the ferromagnet 27a. As a result, the ferromagnet 27a is processed into the metal layer 27. The conductor 26 (and 26r) have a higher resistance against the etching than that of the ferromagnetic elements. For this reason, the conductor 26 serves as a stopper of the etching and the etching is prevented from reaching the ferromagnet 25.

Thus, the metal layer 27 originates in the ferromagnet 27a which is made of the same material as the ferromagnet 27r, and is formed by partial removal of the ferromagnetic elements from the ferromagnet 27a. For this reason, the metal layer 27 has a density lower than that of the ferromagnet 27r, and based on this the metal layer 27 may have a hardness lower than the ferromagnet 27r further based on this.

Figure 6:
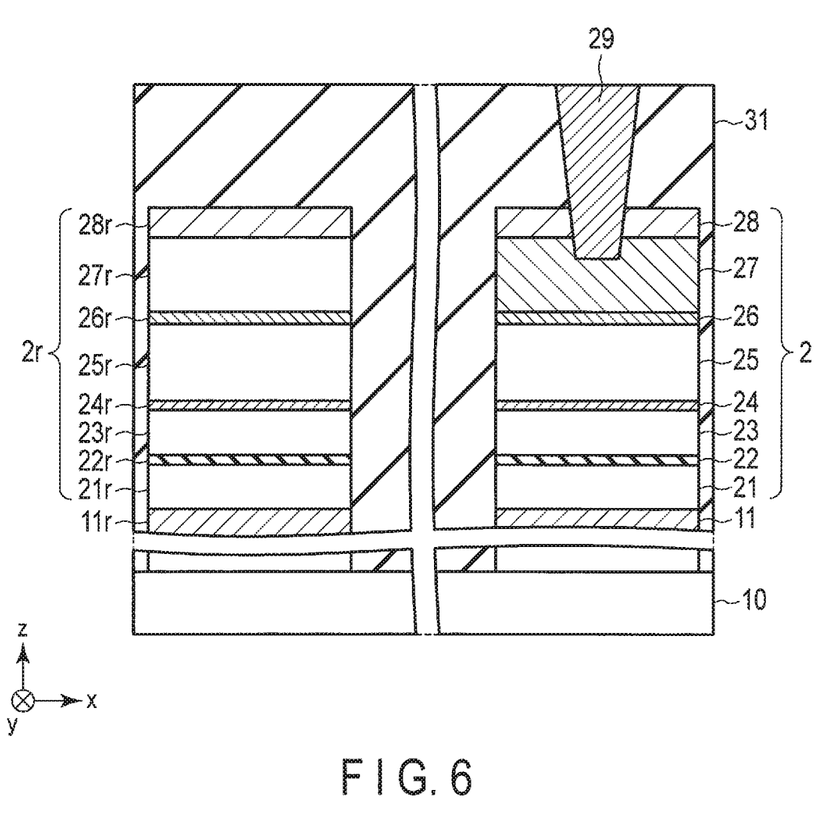
FIG. 6 illustrates a state subsequent to FIG. 5.

As illustrated in FIG. 6, the opening 34 is formed with a conductor therein to form the electrode 29, where the MTJ element 2 is obtained.

The electrode 29r is then formed, which completes the structure illustrated in FIG. 2.

[1-3. Advantages]

According to the first embodiment, the memory device 1 with a high read margin can be formed without a complicated process. The details are as follows.

With the MTJ element 2r used for the reference resistor R, the resistance of the reference resistor R can follow the change in the resistance of the MTJ element 2 due to the temperature through change in the resistance of the MTJ element 2r due to the temperature. Moreover, the ferromagnet 21r, the nonmagnet 22r, and the ferromagnet 23r can be respectively formed through the common processes with the ferromagnet 21, the nonmagnet 22, and the ferromagnet 23. For this reason, the variation in the characteristics of the MTJ element 2r follows that of the MTJ element 2 due to the variation in the various features resulting from the variation in the process of the MTJ element 2, such as shape and thickness. Therefore, the following of variation in temperature characteristics and process variation allows for a high read margin of the memory device 1.

In order for the MTJ element 2r to serve as a reference resistor, the resistance state of the MTJ element 2r, i.e., the magnetization direction of the ferromagnet 21r, needs to be fixed. In the meantime, the resistance state of the MTJ element 2, i.e., the magnetization direction of the ferromagnet 21, needs to be variable.

According to the first embodiment, the MTJ elements 2 and 2r respectively include the metal layer 27 and the ferromagnet 27r originating in the same material. The ferromagnet 27r can use its magnetization to serve to fix the magnetization direction of the ferromagnet 21r in a particular direction. In contrast, the MTJ element 2 does not include the ferromagnet 27r, but includes the metal layer 27. The metal layer 27 contains only a limited total amount of ferromagnetic elements, and therefore does not prevent switching of the magnetization direction of the ferromagnet 21. Therefore, the MTJ element 2 can serve as a memory cell.

In addition, the metal layer 27 can be formed by removing the ferromagnetic elements from a material that will be processed into the ferromagnet 27r. This eliminates the necessity of forming the ferromagnet 27r and the metal layer 27 through separate processes, and allows for formation of the metal layer 27 and the ferromagnet 27r by only an additional process of removing the ferromagnetic elements after the formation of the material used as the ferromagnet 27r. Therefore, the MTJ elements 2 and 2r can be formed through a few added processes, and without affecting the ferromagnets 21 and 21r, the nonmagnets 22 and 22r, the ferromagnets 23 and 23r, the conductors 24 and 24r, and the ferromagnets 25 and 25r, which are positioned under the ferromagnet 27r and the metal layer 27.

Second Embodiment

Figure 7:
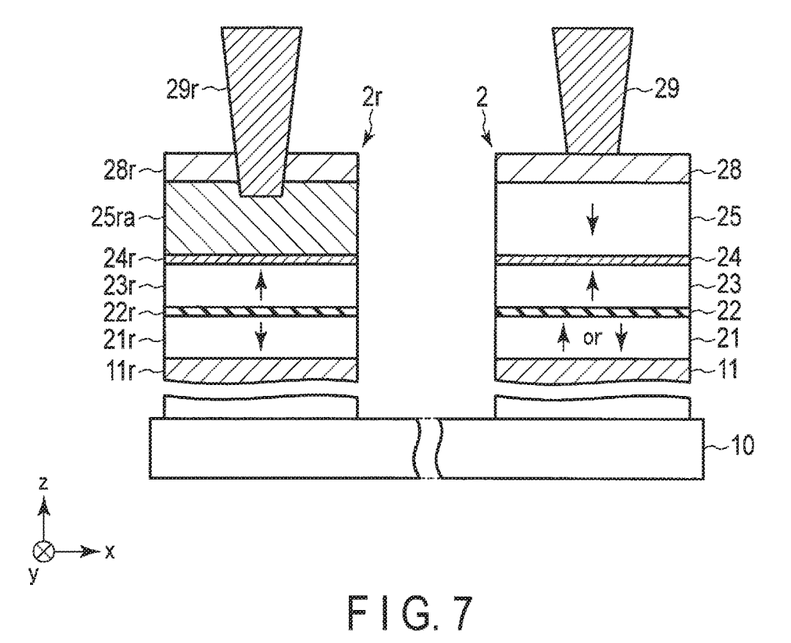
FIG. 7 illustrates a cross-sectional structure of a part of a magnetoresistive memory device according to a second embodiment.

FIG. 7 illustrates apart of a cross-sectional structure of a magnetoresistive memory device 1 according to the second embodiment, and illustrates MTJ elements 2 and 2r according to the second embodiment.

The MTJ element 2 includes the ferromagnet 21, the nonmagnet 22, the ferromagnet 23, the conductor 24, the ferromagnet 25, and the conductor 28, but not the conductor 26 or the metal layer 27 of the first embodiment. The conductor 28 is provided on the ferromagnet 25.

The ferromagnet 25 contains one or more of ferromagnetic elements, and one or more of metallic elements. Examples of the ferromagnetic elements include Fe, Co, and Ni. Examples of the metallic elements include precious metal elements, such as platinum (Pt) and Pd. The ferromagnet 25 may include or is made of an alloy of a ferromagnetic element and metallic element. The ferromagnet 25 may include a layer of a ferromagnetic element and a layer of metallic element, or, for example, alternately stacked layers of a ferromagnetic element and layers of metallic elements, as the ferromagnet 27r.

The MTJ element 2r includes the ferromagnet 21r, the nonmagnet 22r, the ferromagnet 23r, the conductor 24r, a metal layer 25ra, and the conductor 28r, but not the ferromagnet 2 the conductor 26r, or the ferromagnet 27r of the first embodiment. The conductor 28r is provided on the metal layer 25ra.

The metal layer 25ra has the same or substantially the same dimensions as those of the ferromagnet 25, is made of the same material as the ferromagnet 25, and contains the same elements as the ferromagnet 25, for example. Specifically, the metal layer 25ra contains one or more of one or more ferromagnetic elements contained in the ferromagnet 25, and one or more of one or more metallic elements contained in the ferromagnet 25. The metal layer 25ra, however, contains the ferromagnetic elements of the total amount different from that of the ferromagnetic elements contained in the ferromagnet 25. Specifically, the metal layer 25ra contains the ferromagnetic elements of a quantity of 30% or less of the volume of the metal layer 25ra.

The metal layer 25ra can be formed through the same process as that for processing the ferromagnet 27A into the metal layer 27 and the ferromagnet 27r in the first embodiment. Specifically, the material to be processed into the ferromagnet 25 is formed in an area in which the ferromagnet 25 and metal layer 25ra will be formed. The ferromagnetic elements are then partially removed from the material used as the ferromagnet 25 in the portion where the metal layer 25ra will be formed.

The MTJ element 2 has a shift magnetic field of a magnitude of zero, substantially zero, or close to zero with the ferromagnet 25. In contrast, the MTJ element 2r does not include a layer which brings the shift magnetic field of the MTJ element 2 as close to zero as the ferromagnet 25, i.e., a layer corresponding to the ferromagnet 25r of the first embodiment. For this reason, in the MTJ element 2r, the ferromagnet 21r has a shift magnetic field of the same direction as the magnetization direction of the ferromagnet 23r. In other words, the MTJ element 2r stabilizes in the P-state more easily than in the AP-state.

The electrode 29 is at its bottom in contact with the top of the conductor 28. The electrode 29r is located above and inside the conductor 28r, includes a portion ranging from the top to the bottom of the conductor 28r, and is in contact with the metal layer 25ra.

An insulator (not shown) is provided in the area above the substrate 10 free from the components illustrated in FIG. 7.

Figure 8:
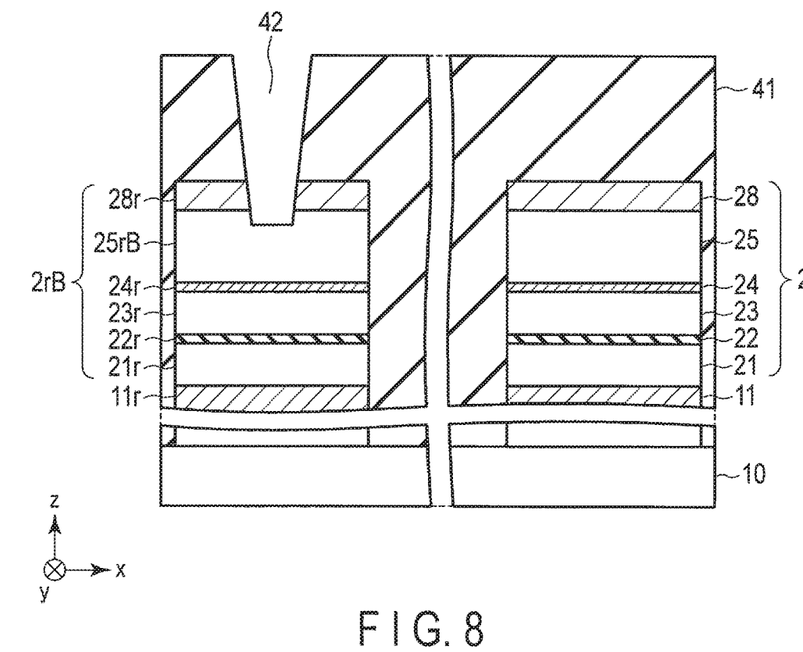
FIG. 8 illustrates one state during a manufacturing process of the magnetoresistive memory device according to the second embodiment.

FIG. 8 illustrates one state of a part of the magnetoresistive memory device 1 in the manufacturing process according to the second embodiment. First, the MTJ element 2 and a structure including the ferromagnet 21r, the nonmagnet 22r, the ferromagnet 23r, the conductor 24r, ferromagnet 25rB, and the conductor 28r (to be referred to as an intermediate structure 2rB hereinafter) are formed through the process similar to that of FIG. 3. The ferromagnet 25rB occupies the area of the metal layer 25ra, and is made of the same material as the ferromagnet 25.

An insulator 41 is formed between the MTJ element 2 and the intermediate structure 2rB, and on the MTJ element 2r and the intermediate structure 2rB. An opening 42 is formed in the insulator 41 through the same process as that of FIG. 4. The opening 42 extends through the conductor 28r and reaches the ferromagnet 25rB. During the formation of the opening 42, an area above the insulator 41 in a portion above the MTJ element 2 is covered with a mask.

With a process similar to that of FIG. 5, the ferromagnetic elements in the ferromagnet 25rB are partially removed by etching via the opening 42. As a result, the ferromagnet 25rB is processed into the metal layer 25ra as illustrated in FIG. 7. A conductor is then formed in the opening 42 to form the electrode 29r, and then an electrode 29 is formed, thereby the structure illustrated in FIG. 4 is obtained.

According to the second embodiment, the magnetoresistive memory device 1 includes the MTJ element 2 that has a shift magnetic field of a magnitude of zero or close to zero with the ferromagnet 25, and the MTJ element 2r that has a shift magnetic field of the same direction as the ferromagnet 23r by including no layer corresponding to the ferromagnet 25. For this reason, according to the second embodiment, the MTJ element 2 that can serve as the memory cell MC, and the MTJ element 2r that stabilizes in one of the resistance states (for example, P-state) more easily can be obtained. Therefore, the memory device 1 can be realized that has a high read margin through following the temperature characteristics and the variation of the process, as in the first embodiment.

Moreover, according to the second embodiment, the metal layer 25ra is formed by removing the ferromagnetic elements from the material that will be processed into the ferromagnet 25, as in the first embodiment. Therefore, the MTJ elements 2 and 2r can be formed by a simple method.

Third Embodiment

Figure 9:
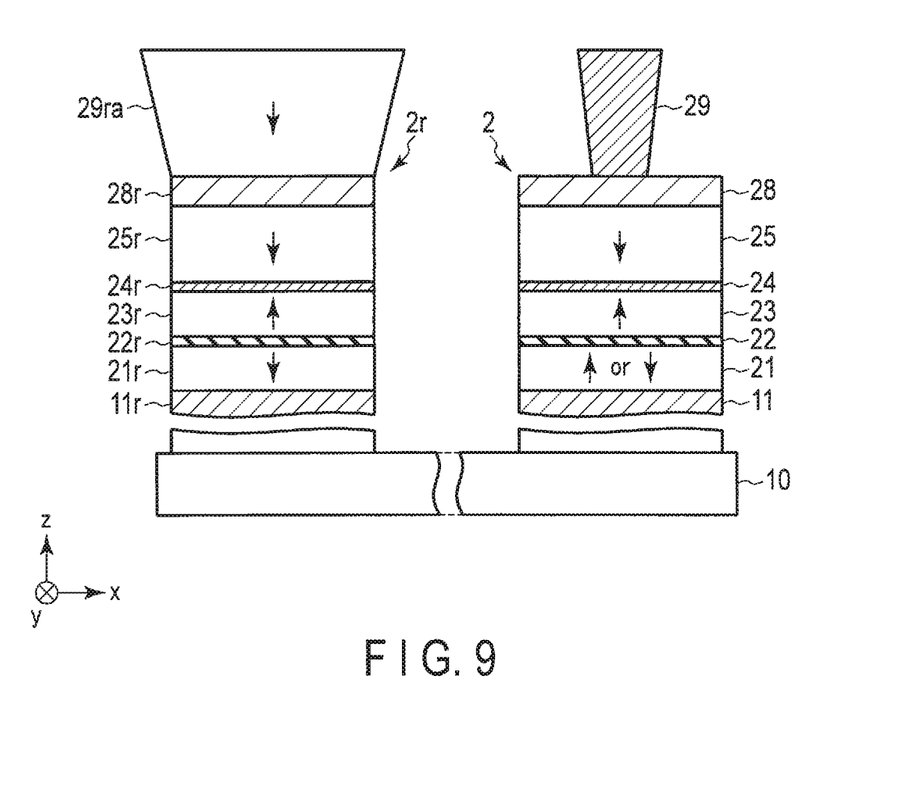
FIG. 9 illustrates a cross-sectional structure of a part of a magnetoresistive memory device according to a third embodiment.

FIG. 9 illustrates a part of cross-sectional structure of a magnetoresistive memory device 1 according to the third embodiment, and illustrates MTJ elements 2 and 2r according to the third embodiment.

The MTJ element 2 has the same structure and features as the MTJ element 2 of the second embodiment.

The MTJ element 2r includes the ferromagnet 21r, the nonmagnet 22r, the ferromagnet 23r, the conductor 24r, the ferromagnet 25r, and the conductor 28r, but not the conductor 26r and the metal layer 27r of the first embodiment. The conductor 28r is provided on the ferromagnet 25r.

The magnetoresistive memory device 1 further includes an electrode 29ra. The electrode 29ra is located in the same layer as the electrode 29, and at its bottom is in contact with the top of the conductor 28r.

The electrode 29ra has functions of not only electrically coupling the MTJ element 2r, in particular the conductor 28r, to another conductor, but also fixing the magnetization direction of the ferromagnet 21r in the direction opposite to the magnetization direction of the ferromagnet 23r (and ferromagnet 25r). To this end, the electrode 29ra has the perpendicular magnetic anisotropy, has a high saturation magnetization and/or a residual magnetization, and has magnetization direction opposite to the magnetization direction of the ferromagnet 23r.

More specifically, the electrode 29ra has larger dimensions than those of the electrode 29, specifically a larger plane shape (a shape along the xy-plane) than that of the electrode 29, or a larger diameter than that of the electrode 29. The electrode 29ra contains or is made of the same material as that of the ferromagnet 27r of the first embodiment.

The electrode 29r may also have a high coercivity. Alternatively, the electrode 29r may have a magnetization direction of the same direction as that of the ferromagnet 23r.

The MTJ element 2 has a shift magnetic field of a magnitude of zero, substantially zero, or close to zero with the ferromagnet 25. In contrast, the MTJ element 2r has a shift magnetic field of a direction opposite to the magnetization direction of the ferromagnet 23r and stabilizes in the AP-state more easily than in the P-state with the electrode 29ra.

The electrode 29ra can be formed through the following process. First, the MTJ elements 2 and 2r are formed. An insulator (not shown) is then formed between the MTJ elements 2 and 2r, and on the MTJ elements 2 and 2r, as in FIG. 4. In the insulator an opening is then formed from the top of the insulator to the conductor 28, and a conductor is formed in the opening, which completes the electrode 29. A lithography process and etching similar to those for an opening for the electrode 29 forms an opening from the top of the insulator to the conductor 28r. The opening is then formed with a conductor for the electrode 29r therein, which completes the electrode 29r.

According to the third embodiment, the magnetoresistive memory device 1 includes the MTJ elements 2 and 2r, and further includes the ferromagnetic electrode 29ra on the MTJ element 2r. The electrode 29ra has the magnetization direction opposite to that of the ferromagnet 23r. This allows the MTJ element 2 to have the same structure as the MTJ element 2, but have a shift magnetic field of the direction opposite to that of the ferromagnet 23r. Therefore, according to the third embodiment, the MTJ element 2 that can serve as the memory cell MC and the MTJ element 2r that easily stabilizes in one of the two resistance states (for example, the AP-state) are obtained, which can realize the memory device 1 with a high read margin as in the first embodiment.

Moreover, according to the third embodiment, the MTJ elements 2 and 2r are formed through the parallel processes, and the electrode 29ra including a ferromagnetic element is then formed only on the MTJ element 2r. This can realize formation of the MTJ element 2 with a shift magnetic field of a magnitude of zero or close to zero therein because of the ferromagnet 25 and the MTJ element 2r with a shift magnetic field through the formation of the electrodes 29 and 29ra with different features after the MTJ elements 2 and 2r are formed. Therefore, the MTJ elements 2 and 2r can be realized through a simple method.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory device comprising:
   a first element including:
   a first ferromagnet,
   a second ferromagnet,
   a first nonmagnet between the first and second ferromagnets,
   a first conductor on the second ferromagnet,
   a third ferromagnet on the first conductor,
   a second conductor on the third ferromagnet, and
   a fourth ferromagnet on the second conductor, the fourth ferromagnet containing a metallic element and one or more ferromagnetic elements; and
   a second element including:
   a fifth ferromagnet,
   a sixth ferromagnet,
   a second nonmagnet between the fifth and sixth ferromagnets,
   a third conductor on the sixth ferromagnet,
   a seventh ferromagnet on the third conductor,
   a fourth conductor on the seventh ferromagnet, and
   a fifth conductor on the fourth conductor, the fifth conductor containing the metallic element and the one or more ferromagnetic elements of a quantity of 30% or less of a volume of the fifth conductor.

2. The device according to claim 1, wherein:
the fourth ferromagnet has a magnetization of an direction parallel to an direction of a magnetization of the third ferromagnet.

3. The device according to claim 2, wherein:
the third ferromagnet is ferromagnetically coupled with the fourth ferromagnet.

4. The device according to claim 3, wherein:
the metallic element comprises at least one of platinum and palladium, and
the one or more ferromagnetic elements comprise at least one of cobalt, iron, and nickel.

5. The device according to claim 4, wherein:
the fourth ferromagnet and the fifth conductor are located at substantially the same level.

6. The device according to claim 5, wherein:
the first ferromagnet, the first nonmagnet, the second ferromagnet, the first conductor, the third ferromagnet, and the second conductor are located at substantially same levels as the fifth ferromagnet, the second nonmagnet, the sixth ferromagnet, the third conductor, the seventh ferromagnet, and the fourth conductor, respectively.

7. The device according to claim 1, wherein:
the second conductor comprises at least one of ruthenium and iridium.

8. The device according to claim 7, wherein:
the fourth conductor comprises at least one of ruthenium and iridium.

9. The device according to claim 8, wherein:
the second conductor ferromagnetically couples the third ferromagnet and the fourth ferromagnet.

10. The device according to claim 9, wherein:
the metallic element comprises at least one of platinum and palladium, and
the one or more ferromagnetic elements comprise at least one of cobalt, iron, and nickel.

11. The device according to claim 10, wherein:
the fourth ferromagnet and the fifth conductor are located at substantially the same level.

12. The device according to claim 11, wherein:
the first ferromagnet, the first nonmagnet, the second ferromagnet, the first conductor, the third ferromagnet, and the second conductor are located at substantially same levels as the fifth ferromagnet, the second nonmagnet, the sixth ferromagnet, the third conductor, the seventh ferromagnet, and the fourth conductor, respectively.

13. The device according to claim 1, wherein:
the fourth ferromagnet has a magnetization of an direction parallel to an direction of a magnetization of the third ferromagnet.

14. The device according to claim 13, wherein:
the second conductor comprises at least one of ruthenium and iridium.

15. The device according to claim 14, wherein:
the fourth conductor comprises at least one of ruthenium and iridium.

16. The device according to claim 15, wherein:
the second conductor ferromagnetically couples the third ferromagnet and the fourth ferromagnet.

17. The device according to claim 16, wherein:
the metallic element comprises at least one of platinum and palladium, and
the one or more ferromagnetic elements comprise at least one of cobalt, iron, and nickel.

18. The device according to claim 17, wherein:
the fourth ferromagnet and the fifth conductor are located at substantially the same level.

19. The device according to claim 18, wherein:
the first ferromagnet, the first nonmagnet, the second ferromagnet, the first conductor, the third ferromagnet, and the second conductor are located at substantially same levels as the fifth ferromagnet, the second nonmagnet, the sixth ferromagnet, the third conductor, the seventh ferromagnet, and the fourth conductor, respectively.

* * * * *